United States Patent [19]

Grube et al.

[11] Patent Number: 5,398,863
[45] Date of Patent: Mar. 21, 1995

[54] SHAPED LEAD STRUCTURE AND METHOD

[75] Inventors: Gary W. Grube, Monroe; Gaetan Mathieu, Carmel; Jason Sweis, Ossining, all of N.Y.; John A. Grange, Cupertino, Calif.

[73] Assignee: Tessera, Inc., San Jose, Calif.

[21] Appl. No.: 96,693

[22] Filed: Jul. 23, 1993

[51] Int. Cl.⁶ ............................................. B23K 31/02
[52] U.S. Cl. ............................... 228/106; 228/180.21
[58] Field of Search ............... 228/106, 180.21, 110.1, 228/5.5, 6.2; 29/835, 827

[56] References Cited

U.S. PATENT DOCUMENTS

| | | | |
|---|---|---|---|
| 5,127,570 | 7/1992 | Steitz et al. | 228/103 |
| 5,148,265 | 9/1992 | Khandros et al. | 357/80 |
| 5,148,266 | 9/1992 | Khandros et al. | 357/80 |

*Primary Examiner*—P. Austin Bradley
*Assistant Examiner*—Jeanne M. Elpel
*Attorney, Agent, or Firm*—Lerner, David, Littenberg, Krumholz & Mentlik

[57] ABSTRACT

In a semiconductor inner lead bonding process, a connection component having leads is disposed on the chip surface so that the leads lie above the contacts. A bond region of each lead is forced downwardly by a tool into engagement with a contact on the chip while a first or proximal end of the lead remains attached to a dielectric support structure. The lead is deformed into an S-shaped configuration by moving the bonding tool horizontally towards the proximal or first end of the lead, thereby forcing the bonding region towards the first end and bending or buckling the lead. Alternatively, the lead is bent downwardly by a tool and the tool may then be disengaged from the lead, shifted away from the proximal end of the lead and again advanced downwardly to secure the lead to the chip contact.

13 Claims, 3 Drawing Sheets

SHAPED LEAD STRUCTURE AND METHOD

FIELD OF THE INVENTION

The present invention relates to the field of semiconductor chip mounting and connection, and more particularly relates to methods of bonding electrical leads to contacts on semiconductor chips and related articles.

BACKGROUND OF THE INVENTION

Semiconductor chips typically are connected to external circuitry through contacts on a surface of the chip. The contacts on the chip typically are disposed in the regular patterns such as a grid substantially covering the front surface of the chip, commonly referred to as an "area array" or in elongated rows extending parallel to and adjacent each edge of the chip front surface. Each contact on the chip must be connected to external circuitry, such as the circuitry of a supporting substrate or circuit panel. Various processes for making these interconnections use prefabricated arrays of leads or discrete wires.

The rapid evolution of a semiconductor art in recent years has created a continued demand for progressively greater numbers of contacts and leads in a given amount of space. An individual chip may require hundreds or even thousands of contacts, all within the area of the chip front surface. For example, a complex semiconductor chip in current practice may have a row of contacts spaced apart from one another at center-to-center distances of 0.5 mm or less and, in some cases, 0.1 mm or less. These distances are expected to decrease progressively with continued progress in the art of semiconductor fabrication.

With such closely-spaced contacts, the leads connected to the chip contacts must be extremely fine structures, typically less than 0.5 mm wide. Such fine structures are susceptible to damage and deformation. With closely spaced contacts, even minor deviation of a lead from its normal position will result in misalignment of the leads and contacts. Thus, a given lead may be out of alignment with the proper contact on the chip or substrate, or else it may be erroneously aligned with an adjacent contact. Either condition will yield a defective chip assembly. Errors of this nature materially reduce the yield of good devices and introduce defects into the product stream. These problems are particularly acute with those chips having relatively fine contact spacings and small distances between adjacent contacts.

Certain connection systems described in U.S. Pat. Nos. 5,148,265 and 5,148,266 include an interposer or connection component incorporating dielectric layers with arrays of prefabricated leads. The leads are connected to the chip thereby connecting terminals on the component to the chip. These terminals are then connected to an external circuit.

Copending, commonly assigned U.S. patent application Ser. No. 07/919,772, filed Jul. 24, 1992, now U.S. Pat. No. 5,360,947 the disclosure of which is incorporated by reference herein, also describes an improved system for connecting semiconductor chips to external circuitry. Certain embodiments of the invention set forth in the '772 application utilize a connection component having a support structure and electrically conductive leads. Each lead has an elongated connection section extending across a gap in the support structure. The connection sections of the leads are flexible. Preferably, one end of each connection section is detachably secured to the support structure, whereas the other end is permanently secured to the support structure and connected to a terminal mounted on the support structure. The connection component is positioned on a part of a semiconductor chip assembly, such as on the chip itself, so that the leads overlie contacts on the part or chip. The connection sections of the leads are bonded to the contacts on the chip by engaging each connection section with a tool, forcing the tool downwardly to break the detachable end of the lead from the support structure and bring the connection section into engagement with a contact on the chip. The tool is used to apply heat, pressure and/or vibrations to the lead, thereby forming a bond between the lead and the contact of the chip. This process is repeated for each lead, until all the leads have been bonded to the contacts on the chip. After the connection component has been electrically connected to the contacts of the chip, the terminals of the connection component can be used to connect the chip to other, external circuitry as, for example, by bonding the terminals of the connection component to an external substrate such as a circuit panel.

In the preferred arrangements disclosed in the '772 application, the bonding tool is arranged to capture and align the lead. Thus, the bonding tool may be a blade-like device with an elongated bottom edge and with a groove extending lengthwise along such bottom edge for engaging leads to be bonded. The groove may have a central plane and surfaces sloping upwardly from the sides of the groove towards the central plane. When the tool is roughly aligned with a lead, so that the lengthwise axis of the bottom edge and groove are generally parallel to the lengthwise axis of the connection section of the lead, the groove will engage the lead and guide it into precise alignment with the tool. Thus, the tool can be aligned in sequence with each contact, and engaged with a lead. Even if the lead is slightly out of alignment with the contact and tool at the beginning of the operation, the tool will bring the lead into precise alignment with the tool and hence with the contact during the downward motion of the tool. Thus, minor dimensional variations in the connection component do not impede the process, even where the contacts are provided at very small spacings.

The copending, commonly assigned U.S. patent application Ser. No. 08/096,700 of Thomas DiStefano et al. entitled SEMICONDUCTOR INNER LEAD BONDING TOOL, filed of even date herewith, the disclosure of which is incorporated by reference herein, discloses a tool for bonding leads to contacts on parts such as semiconductor chips, which tool can operate on leads extending in either of two orthogonal directions. Such a tool is referred to herein as a "bidirectional" tool. A bidirectional tool has a body with a lower end surface including a bonding surface region. The lower end of the tool may define guide surfaces for engaging elongated leads disposed beneath the lower end of the tool upon downward movement of the tool from above the leads. The guide surfaces are adapted to engage an elongated lead extending generally in a first horizontal direction beneath the lower end and to guide any such lead generally in a second horizontal direction orthogonal to the first direction so as to align the lead with the bonding region of the lower end. The guide surfaces are also adapted to engage an elongated lead extending generally in the second horizontal direction beneath the lower end and to guide the lead generally in the first horizontal direction so as to align such a lead with the bonding region. Stated another way, the guide surfaces are adapted to engage a lead extending in either of two mutually orthogonal directions and to center the engaged lead beneath the bonding region of the lower end so that the lead can be engaged and bonded by the tool.

A tool of this nature will operate on leads extending in either of two mutually orthogonal directions relative to the tool. With either orientation of the lead, the tool will capture and align the lead, and bring the lead into position for bonding. Such a tool can be used in procedures generally similar to those discussed above with reference to the '772 application. Use of a bidirectional tool simplifies the process in that there is no need to rotate the tool relative to the parts.

SUMMARY OF THE INVENTION

The present invention provides additional improvements in bonding processes. One aspect of the present invention provides a method of making connections to a part of a semiconductor chip assembly, such as to the chip itself. The method includes the step of juxtaposing a connection component with the part so that a support structure in the connection component overlies a contact-bearing front surface of the part and so that elongated connection sections of leads on the connection component extend from the support structure above the contacts. Thus, the leads may protrude outwardly beyond the outermost edge of the support structure, or else may extend across gaps or holes in the support structure, so that the leads are disposed above the contacts on the part.

The method according to this aspect of the invention further includes the step of bonding the connection section of each lead to a contact on the part by engaging a tool with a bond region of the connection section and displacing the tool and the bond region downwardly towards the part so as to bring the bond region of the connection section into engagement with the contact, while leaving a first or proximal end of the connection section attached to the support structure. Most preferably, the method further includes the step of moving the tool and the bond region of the connection section during the bonding step relative to the support structure and relative to the first end of the connection section with a component of motion in a horizontal direction towards the first or proximal end of the connection section. This component of motion tends to relieve tension in the lead induced by the downward motion.

Most preferably, the horizontal component of movement of the tool and the bond region during the bonding step is sufficient to relieve all tension in the region of the connection section between the bond region and the first end of the connection section. Indeed, the horizontal displacement of the bond region towards the first end desirably is sufficient to bend or buckle the lead so that when the bonding step is completed, the portion of the connection section between the bond region and the first end of the connection section is curved. Thus, after the bonding step, the distance along the connection section between the first end of the connection section and the bond region is greater than the straight-line distance between these features. Preferably, the bonded lead has a generally S-shaped configuration. Because the bonded lead is not under tension, it does not tend to pull the adjacent regions of the support structure downwardly, and indeed can aid in supporting the adjacent regions of the support structure at a desired elevation above the surface of the part or chip. Because leads bonded by this process are substantially relieved of initial tension, they tend to resist breakage during service. Moreover, the curved lead configuration provides enhanced flexibility in the finished lead so that the lead can accommodate movement of the support structure relative to the chip or part, such as that induced by thermal expansion and contraction, with minimal stress.

A further aspect of the invention also provides methods of making connections to a part of a semiconductor chip assembly, such as to the chip itself. Methods according to this aspect of the invention likewise include a step of juxtaposing the connection component with the part so that the support structure in the connection component overlies a contact-bearing front surface of the part. Again, elongated connection sections of leads on the connection component extend from the support structure above the contacts on the part.

In methods according to this aspect of the present invention, the bonding step of the process includes an initial deforming step. In the initial deforming step, a deforming region of the connection section relatively close to the proximal or first end of the lead is engaged with a tool, and that tool and the deforming region are displaced downwardly towards the part so as to move the deforming region of the connection section downwardly towards the part, while leaving the first end of the connection section attached to the support structure. After the deforming step, a bond region of the connection section is secured to the contact. The bond region of the connection section is disposed distally or farther away from the first end of the connection section than the deforming region. Preferably, the same tool is used in the deforming step and the securing step. Thus, the bonding step desirably includes the step of moving the tool used in the deforming step relative to the connection section of the lead after the deforming step with a horizontal component of motion away from the first end, and then engaging the same tool with the bond region of the connection section and forcibly engaging the bond region of the connection section with the contact using the tool. Preferably, the bonding step also includes the step of disengaging the tool from the deforming region of the lead after the deforming step so that the tool is disengaged from the lead during the movement with a horizontal component.

In methods according to this aspect of the invention, the initial deforming step desirably bends the lead into a deformed configuration with an inner or proximal part of the lead, from the support structure and the first end of the lead to the deforming region of the lead extending generally downwardly. An outer or distal portion of the lead, from the deforming region to the bond region and beyond extends generally horizontally, relatively close to the front surface of the part and over the contact. Once the lead has been initially deformed in this manner, engagement of the tool with the bond region, and the slight downward movement of the bond section to secure the bond section to the contact does not induce appreciable tension in the lead. After the bonding process is complete, the lead desirably has a curved, preferably S-shaped, configuration as discussed above, so that the distance along the lead from the first end (from the point of attachment of the lead and the support structure) to the bond and contact is greater than the straight-line distance between the two features. Once again, the finished, bonded lead is desirably not under substantial tension.

Methods according to the aforementioned aspects of the present invention can be employed, for example, with connection components having the lead extending across a gap in the support structure. Desirably, the connection section of each lead has a second end, remote from the first end, connected to the support structure on the opposite side of the gap from the first end of the lead so that prior to the bonding step such lead is supported by the support structure on both sides of the gap. Where such connection components are employed, the bonding step for each lead desirably includes the step of detaching the second end of the lead from the support structure. Most preferably, a compliant layer is provided between the front surface of the part and the portion of the support structure holding the first ends of the leads. Such a compliant layer may be incorporated in the support structure or provided separately, between the support structure and the chip or part. As described, for example, in U.S. Pat. Nos. 5,148,265 and 5,148,266, such a compliant layer is particularly useful in providing for movement of electrical terminals on the support structure to accommodate tolerances and the like and to facilitate testing of the assembly. The methods according to the present invention are particularly useful with structures incorporating compliant layers. Because the leads are not under tension, the compliant layer is not deformed by tension in the leads.

These and other objects, features and advantages of the present invention will be more readily apparent from the detailed description of the preferred embodiment set forth below, taken in conjunction with the accompanying drawings.

DETAILED DESCRIPTION OF THE PREFERRED EMBODIMENTS

Figure 1:
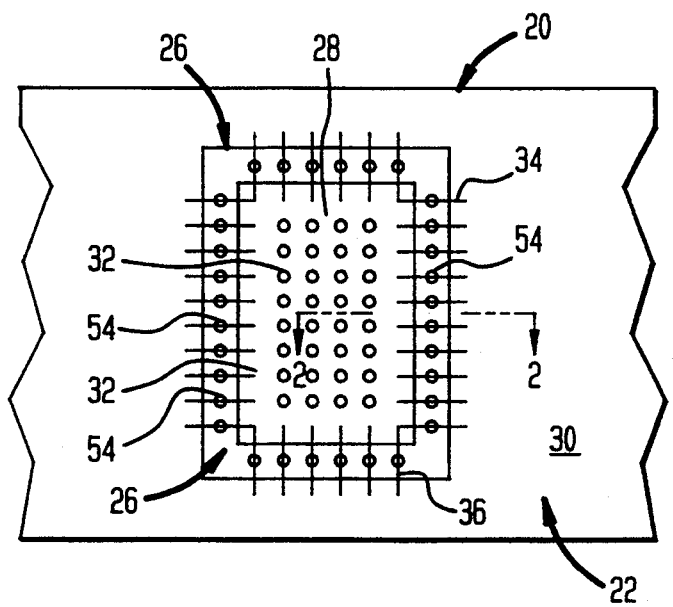
FIG. 1 is a fragmentary, diagrammatic, plan view depicting portions of a connection component and chip at one stage in a process according to one embodiment of the invention.

A process according to one embodiment of the invention utilizes a connection component 20 incorporating a top, dielectric layer formed from a thin, flexible film of dielectric material such as a polyimide and a bottom compliant layer 24 formed from a relatively soft compliant material such as an elastomer. Layers 22 and 24 constitute a support structure. The support structure has a series of elongated gaps 26 extending entirely through both layers and joining with one another so that the gaps subdivide the support structure into a central portion 28 and an outer portion 30 surrounding the central portion. Electrically conductive terminals 32 are disposed on the central portion 28 of the support structure. Each terminal 32 is connected to an electrically conductive metallic lead 34. Each lead 34 has an elongated strip-like connection section 36 extending entirely across one of the gaps 26. The leads are distributed substantially side-by-side along each gap, so that all of the gaps are bridged by different leads.

The connection section of each lead has a first or proximal end 38 permanently connected to the interior portion 28 of the support structure and a second or distal end 40 releasably connected to the outer portion 30 of the support structure on the opposite side of the gap 26. The second end 40 of the connection section may be secured to the outer portion 30 of the support structure by way of a frangible element or frangible section 42 in the lead itself. Each such frangible section 42 connects the second end 40 of the connection section to a second end securement section 44 on outer portion 30. The second end securement sections 44, in turn, may be secured to a common metallic anchor or bus (not shown) on the outer portion 30. The connection sections 36 of the leads may be formed principally or entirely from metallic materials such as gold, and the frangible sections 42 may have smaller cross-section than the remainder of the connection section. Merely by way of example, the connection section 36 of each lead may be about 25 microns thick and about 25 microns wide. The frangible section 42 of each lead may be formed by a pair of V-shaped notches in the lateral edges of the lead. The notches may define a neck or narrowest section about 12 microns wide. Components with frangible sections are described, for example, in the aforementioned U.S. patent application Ser. No. 07/919,772, as well as in the copending, commonly assigned, PCT International Application PCT/US93/06930 claiming priority thereof, filed of even date herewith, the disclosures of which applications are also incorporated by reference herein.

In a process according to one embodiment of the invention, this connection component is juxtaposed with a chip 50 having a front face 52 with rows of contacts 54 on such front face, so that the support structure overlies the front face 52. Gaps 26 in the support structure are aligned with the rows of contacts 54 in the chip, so that the connection sections 36 of the leads extend above contacts 54. Chip 50 is supported by a fixture 56. The outer portion 30 of the support structure, which extends beyond the edge of chip 50, is held by ring-like fixture 58 surrounding chip 50. Thus, the support structure (layers 22 and 24) and the chip are in fixed position relative to fixture 56.

Figure 2:
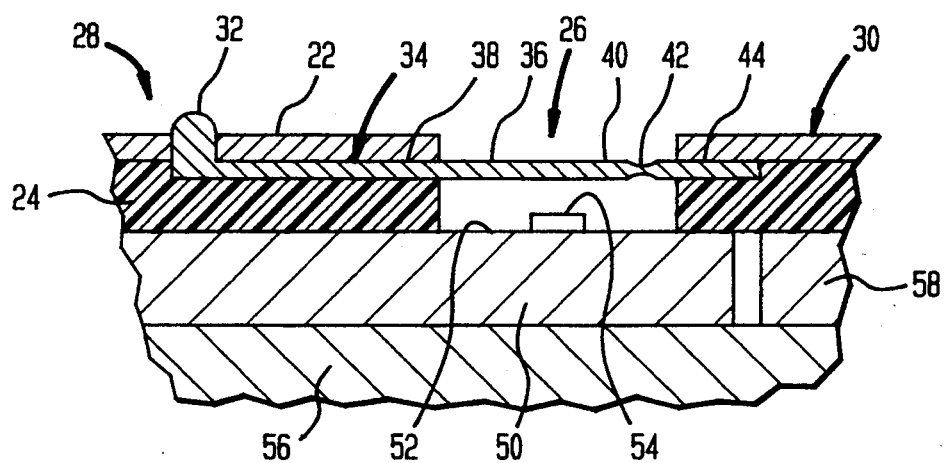
FIG. 2 is a fragmentary, diagrammatic, elevational view of along the lines 2—2 in FIG. 1.

As used in this disclosure, the term "upwardly" refers to the direction perpendicular to the front or contact bearing surface 52 of the chip and away from the chip, i.e., the direction toward the top of the drawing in FIG. 2. Conversely, the term "downwardly" refers to the direction perpendicular to the front surface 52 of the chip but towards the chip. The term "vertical" refers to the upward and downward directions, whereas the term "horizontal" refers to directions perpendicular to the vertical direction, and hence generally parallel to the front surface 52 of the chip. Stated another way, the horizontal directions are the directions usually referred to in the semiconductor art as the "X" and "Y" directions parallel to the chip face, whereas the vertical directions are those directions usually referred to as the "Z" directions. The horizontal and vertical directions referred to herein need not correspond to the conventional horizontal and vertical directions defined by reference to gravity.

Figure 3:
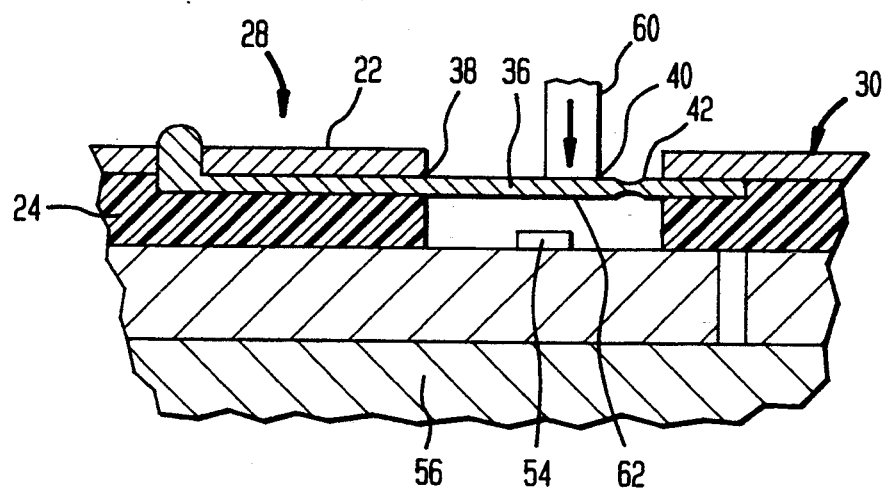
FIGS. 3–5 are views similar to FIG. 2 but depicting other stages in the process of FIGS. 1–2.

After the connection component and the chip have been juxtaposed as illustrated in FIG. 2, a tool 60 (FIG. 3) is advanced downwardly so as to bring the tool into engagement with a bond region 62 of the connection section 36 of one lead. Bond region 62 is disposed adjacent the second end 40 of the connection section and hence adjacent the frangible section 42 of the lead. The tool may be a bidirectional bonding tool as described hereinabove. As the tool encounters the lead, sloping surfaces on the tool capture the lead and bring the lead into alignment with the center of the tool. The tool is held in a conventional thermosonic, thermocompression or ultrasonic bonding machine having programmable motion control. The machine is arranged to move tool 60 and fixture 56 relative to one another vertically and horizontally as directed by a software program.

Figure 4:
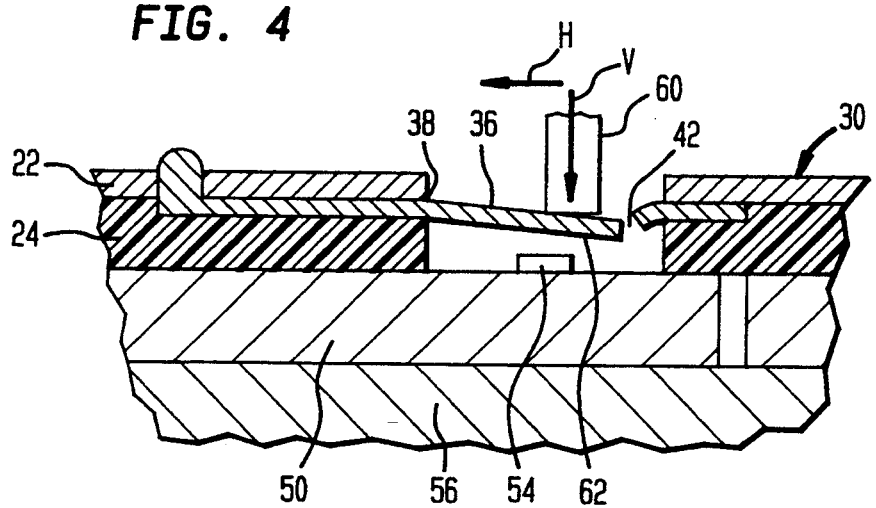
Figure 5:
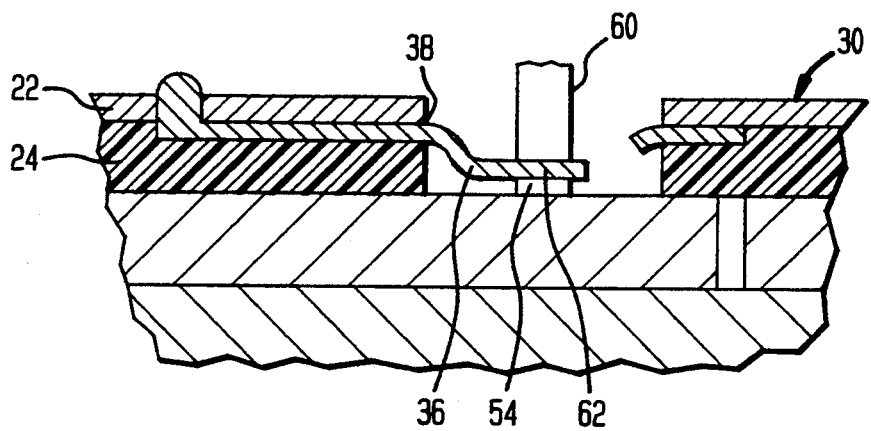

As tool 60 moves downwardly, it bears forcibly on the bond region and thus becomes firmly engaged with the bond region. As tool 60 moves further downwardly, frangible region 42 breaks, thus disconnecting the second end 40 of the connection section from outer portion 30 of the support structure, but leaving the first end 38 attached to the support structure. In this condition (FIG. 4) pure vertical movement of the tool would tend to move the bond region downwardly, away from the fixed first end 38 and would place the intervening portions of connection section 36 in tension. In the process according to this embodiment of the invention, however, tool 60 moves with a horizontal component of motion during further downward travel. Accordingly, the tool 60 is moved, relative to the fixture 56, and hence relative to the chip 50, the support structure (layers 22 and 24), and the fixed first end 38 of the lead connection section with a horizontal component of motion indicated by vector H in FIG. 4, as well as with a vertical component V. The horizontal component of motion is directed in a proximal horizontal direction, toward the first end 38 of the connection section. This combined movement continues until the bond region of the connection section bottoms on the contact 54 of the chip, as illustrated in FIG. 5.

Desirably, the horizontal component of motion is at least sufficient to counteract any increase in the distance between the first end 38 of the connection section and the bond region 62 caused by the downward motion. Stated another way, the minimum horizontal movement required to completely relieve the stress would be equal to the horizontal movement of bond region 62 swinging in an arc of fixed radius about the first end 38 of the connection section (about the edge of the support structure). That theoretical minimum would be approximated by $$H = R(1 - \cos\theta)$$

where: H is the minimum horizontal movement;
R is the initial distance from the first end 38 of the connection section to the bond region 62; and
$\theta$ is arcsin (V/R) in which V is the vertical movement distance from the point where the tool engages the bond region to the point where the bond region engages the contact.

Preferably, however, the horizontal component of movement is greater than this minimum, and hence greater than the amount required to relieve tension in the connection section. As illustrated in FIG. 5, the horizontal movement desirably is great enough to bend the connection section of the lead into a generally S-shaped configuration, in which that portion of the connection section between first end 38 and bond region 62 is curved. Stated another way, the distance along the lead itself, between first end 38 and bond region 62 is greater than the length of a straight line connecting the first end 38 and the bond region. As illustrated, in this stage of the process, the lead has a generally S-shaped configuration, with the portions adjacent first end 38 and bond region 62 being nearly horizontal, and with the intervening portions being curved and more nearly vertical.

After moving the bond region 62 into engagement with contact 54, tool 60 is actuated to secure the connection section to the contact, as by thermocompression, thermosonic, ultrasonic or other bonding techniques, typically involving application of heat, pressure and/or vibration to the lead through the tool 60. After the bond region is secured to the contact, the tool 60 is retracted upwardly and aligned with another lead, and the process is repeated. This process is repeated until all of the leads have been bonded to their respective contacts on the chip. During the bonding process, each lead is severed from the outer portion 30 of the support structure. At the beginning of the process, the central portion 28 of the support structure is connected to the outer portion through the leads. During the process, the central portion is connected in part to the chip by those leads which have been bonded and in part to the outer portion of the support structure by the remaining unsevered leads. After the process, the central portion 28 of the support structure is entirely detached from the outer portion 30, and the outer portion may be removed.

Because the leads are not placed in tension during the bonding process, the support structure is not deformed. That is, the compliant lower layer 24 is not compressed downwardly adjacent to gaps 26, and hence dielectric layer 22 remains in its normal, undistorted position. Indeed, depending upon the amount of horizontal movement imparted to the tool and to the bond region, the connection sections 36 can be placed in some compression, so that they aid in supporting the edges of dielectric layer 22.

After bonding, the assembled chip and connection component can be used as described in the aforementioned patents and copending applications, for connection to a larger circuit element such as a module, wherein terminals 32 of the connection component are soldered or otherwise electrically connected to contact pads on a support substrate, thus connecting the leads and the chip contacts 54 to the substrate.

Figure 6:
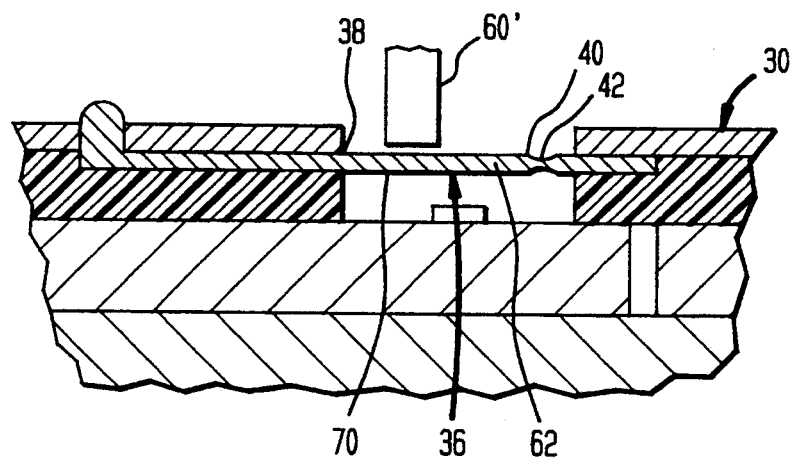
FIGS. 6–8 are views similar to FIG. 2 but depicting stages in a process according to a further embodiment of the invention.
Figure 7:
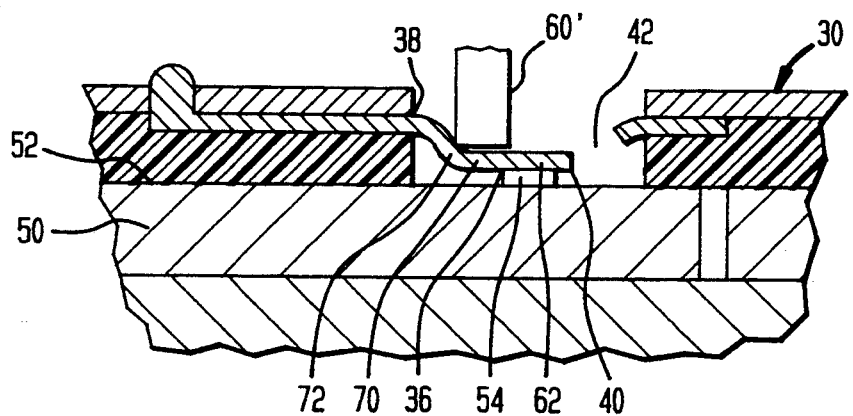

A process according to a further embodiment of the invention utilizes a chip and substrate as discussed above, and includes the step of initially juxtaposing the chip and the substrate with one another, as discussed above with reference to FIG. 2. In this process, however, the tool 60' is first engaged with an initial deformation region 70 disposed proximally of the bond region 62. That is, the deformation region 70 is disposed between the bond region 62 and the fixed or first end 38 of the connection section. As illustrated in FIGS. 6 and 7, tool 60' moves downwardly while engaged with deformation region 70, thus breaking frangible section 42. The downward movement of the tool and of the deformation section 70 brings the lead to a condition as illustrated in FIG. 7, wherein a proximal portion 72 of the connection section, between the first end 38 of the connection section and deformation region 70, extends downwardly, and wherein the distal or outer portion of the connection section, including the region from deformation region 70 to the bond region 62 extends generally horizontally, in close proximity to the front face 52 of chip 50 and in close proximity to the contact 54. Stated another way, in this stage of the process, the lead is deformed into a generally S-shaped configuration with the lower or distal portion including the bond region 62 extending in a generally horizontal direction. In this initial deformation step, the proximal portion 72 of the connection section may be placed under some tension. However, such tension does not persist.

Immediately after the initial deformation step, tool 60' is retracted upwardly so as to disengage it from the lead, then moved with a horizontal component of motion H' in the distal direction, away from the first end 38 of the lead, to align the tool with the bond region 62 and the contact. As the tool is moved upwardly to disengage it from the lead, and as the tool moves in the distal horizontal direction H', any tension in the proximal portion 72 of the lead is relieved, and at this moment the connection is not secured to the chip.

After this disengagement and horizontal movement, the tool is moved downwardly again to engage bond region 62 with contact 54. The downward motion of the tool and the bond region 62 during this stage of the process does not induce substantial tension in the lead because the bond region 62 is already is close proximity to contact 54. Thus, there is little or no vertical travel of the bond region during this stage of the process. Moreover, the S-shaped structure previously established in the initial deformation stage can deform to take up any travel of bond region 62 away from the first end 38.

The bonding equipment utilized in the processes discussed above typically incorporates programmable movement devices, so that the vertical and horizontal movement of the bonding tool relative to the fixture and the other components in both horizontal and vertical directions can be controlled as desired. Such programmable bonding equipment is well known in the semiconductor bonding art. However, the horizontal movement capabilities of the bonding equipment typically have been utilized heretofore only in aligning the bonding tool with the work piece, and in indexing the work relative to the tool for making multiple bonds. In the processes described hereinabove, the horizontal movement capability is used concomitantly with the vertical movement of the tool in the bonding process.

Figure 8:
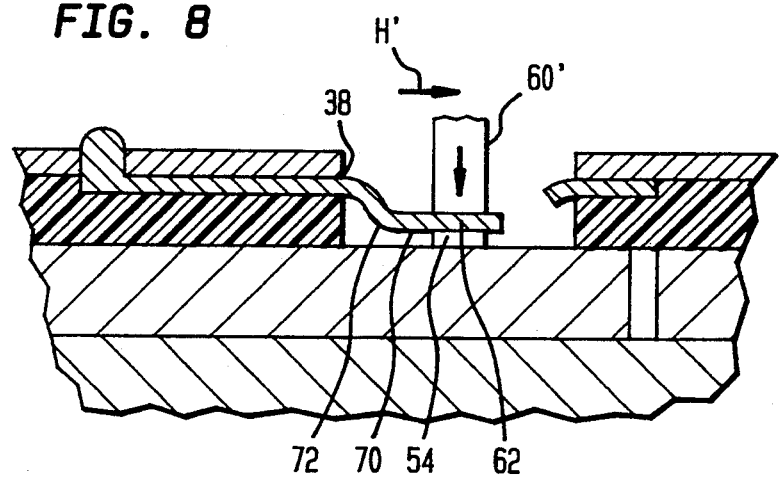

In the process discussed above with reference to FIGS. 1–5, tool 60, and hence bonding region 62, may move horizontally at the same time as they move vertically downwardly, so that the tool and the bonding region describe an arcuate, inclined or sloping path oblique to the horizontal and vertical directions. Alternatively, the horizontal movement component can be applied before or after the vertical movement. In the process discussed above with reference to FIGS. 6–8, the bonding tool can be given a horizontal component of motion in the proximal direction as discussed above with reference to FIGS. 1–5 during the initial deforming step, during the final downward travel to secure the bond region, or both.

Although the process has been illustrated hereinabove with reference to a connection component having a particular geometry and gap structure, it should be clearly appreciated that the process can be employed with a wide variety of connection components. Merely by way of example, the connection components used with chips having so-called "area array" contact configurations may have a plurality of small, unconnected holes extending through the support structure, and one or a few leads extend across each such hole. Other connection components have elongated gaps 26 in the support structure as illustrated in FIG. 1, but such gaps are not connected to one another so that portions of the support structure permanently connect the central and peripheral regions. Also, the bonding process may be used with connection components having other arrangements for supporting the second or distal end of the connection sections. Thus, some connection components have the second end of each connection section releasably attached to the support structure by means other than a frangible section as, for example, by a weak bond therebetween. Still other connection components may have the second ends of the connection sections unattached, i.e., so that the leads simply protrude from an edge of the support structure or protrude only part way across a gap in the support structure. The bonding methods according to the present invention can be utilized with these and other connection component configurations. Also, although the bonding procedures according to the present invention are particularly adapted to use in bonding leads to semiconductor chips, the same procedures can be utilized in bonding leads to other parts of a semiconductor chip assembly and to other components.

As these and other variations and combinations of the features discussed above can be utilized without departing from the present invention, the foregoing description of the preferred embodiment should be taken by way of illustration rather than by way of limitation of the present invention as defined by the claims.

What is claimed is:

1. A method of making connections to a part of a semiconductor chip assembly comprising the steps of:
   (a) juxtaposing a connection component with the part so that a support structure in said connection component overlies a front surface of a part of said assembly having contacts thereon and so that elongated connection sections of leads on said connection component extend from said support structure above said contacts;
   (b) bonding said connection section of each said lead to a contact on said part by engaging a tool with a bond region of the connection section and displacing the tool and bond region downwardly towards said part so as to bring the bond region of the connection section into engagement with the contact while leaving a first end of the connection section attached to said support structure; and
   (c) during said bonding step for each said lead, moving said tool and the bond region of the connection section relative to said support structure and relative to the first end of said connection section with a component of motion in a horizontal direction towards said first end of the connection section.

2. A method as claimed in claim 1 wherein, for each lead said step of moving said tool with a horizontal component of motion is commenced after the tool has been engaged with the bond region.

3. A method as claimed in claim 1 wherein for each lead said step of moving the tool and the bond region with a horizontal component of motion is performed during the step of displacing said tool and the bond region downwardly so that for at least part of the downward movement of the tool, the tool and the bond section moves along a path having horizontal and vertical components of motion.

4. A method of making connections to a part of a semiconductor chip assembly comprising the steps of:
   (a) juxtaposing a connection component with the part so that a support structure in said connection component overlies a front surface of a part of said assembly having contacts thereon and so that elongated connection sections of leads on said connection component extend from said support structure above said contacts; and (b) bonding said connection section of each said lead to a contact on said part by (i) deforming the connection section by engaging a tool with a deforming region of the connection section and displacing said tool and the deforming region downwardly towards said part so as to move the deforming region of the connection section downwardly towards the part while leaving a first end of the connection section attached to said support structure; then (ii) securing a bond region of the connection section to the contact, the bond region being further from the first end than the deforming region.

5. A method as claimed in claim 4 wherein said bonding step includes the steps of moving the tool used in said deforming step relative to said connection section of said lead after said deforming step with a horizontal component of motion away from said first end, then engaging the same tool with the bond region of the connection section and engaging the bond region of the connection section with the contact by using such tool.

6. A method as claimed in claim 5 wherein said bonding step includes the step of disengaging the tool from the connection section of the lead so that the tool is disengaged during said movement with said horizontal component.

7. A method as claimed in claim 1 or claim 4 wherein the connection section of each said lead extends across a gap in the support structure and has a second end connected to said support structure on the opposite side of the gap from the first end of such lead so that prior to said bonding step each said lead is supported by said support structure on both sides of said gap, and wherein said bonding step for each said lead includes the step of detaching the second end of the lead from the support structure.

8. A method as claimed in claim 7 wherein said at least one gap includes a continuous gap entirely surrounding a central portion of said support structure so that prior to said bonding step said central portion is connected to an outer portion of said support structure only through said connection sections of said leads whereby said central portion is detached from said outer portion during said bonding step.

9. A method as claimed in claim 1 or claim 4 wherein said support structure includes a flexible, sheetlike dielectric layer, said connection component including terminals on said dielectric layer connected to said first ends of said leads, whereby said terminals will be connected to said contacts on said part in said bonding step.

10. A method as claimed in claim 9 further comprising the step of providing a compliant layer between said dielectric layer of said support structure and said part.

11. A method as claimed in claim 1 or claim 4 wherein during said bonding step that portion of the connection section between the bond region and the first end of the connection section is deformed into a generally S-shaped curve.

12. A method as claimed in claim 1 or claim 4 wherein during the bonding step the portion of the connection section between the bond region and the support structure is deformed into a curve so that the distance along the connection section between the first end of the connection section and the bond region is greater than the straight line distance between the first end of the connection section and the bond region.

13. A method as claimed in claim 1 wherein for each lead, the horizontal component of movement of the tool and the bond region during the bonding step is sufficient to relieve any tension in the portion of the connection section between the bond region and the first end of the connection section.

* * * * *